US012573586B2

(12) United States Patent
Nakamura et al.

(10) Patent No.: US 12,573,586 B2
(45) Date of Patent: Mar. 10, 2026

(54) CHARGED PARTICLE BEAM APPARATUS

(71) Applicant: Hitachi High-Tech Corporation, Tokyo (JP)

(72) Inventors: Yohei Nakamura, Tokyo (JP); Natsuki Tsuno, Tokyo (JP); Yasuhiro Shirasaki, Tokyo (JP); Minami Shouji, Tokyo (JP); Shota Mitsugi, Tokyo (JP); Yuko Sasaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 421 days.

(21) Appl. No.: 18/031,359

(22) PCT Filed: Oct. 26, 2020

(86) PCT No.: PCT/JP2020/040104

§ 371 (c)(1),
(2) Date: Apr. 12, 2023

(87) PCT Pub. No.: WO2022/091180

PCT Pub. Date: May 5, 2022

(65) Prior Publication Data

US 2023/0377837 A1     Nov. 23, 2023

(51) Int. Cl.
*H01J 37/26* (2006.01)
*H01J 37/22* (2006.01)
(Continued)

(52) U.S. Cl.
CPC .......... *H01J 37/265* (2013.01); *H01J 37/226* (2013.01); *H01J 37/244* (2013.01); *H01J 37/28* (2013.01); *H01J 2237/2448* (2013.01)

(58) Field of Classification Search
CPC .. H01J 37/00; H01J 37/02; H01J 37/26; H01J 37/265; H01J 37/226; H01J 37/244;
(Continued)

(56) References Cited

U.S. PATENT DOCUMENTS

2003/0057971 A1     3/2003   Nishiyama et al.
2003/0094572 A1     5/2003   Matsui et al.
(Continued)

FOREIGN PATENT DOCUMENTS

JP     2003-100823 A     4/2003
JP     2003-151483 A     5/2003
(Continued)

OTHER PUBLICATIONS

International Search Report of PCT/JP2020/040104 dated Dec. 22, 2020.
(Continued)

*Primary Examiner* — Jason L McCormack
(74) *Attorney, Agent, or Firm* — MATTINGLY & MALUR, PC

(57) ABSTRACT

Charged particle beam apparatus includes: a charged particle optical system to irradiate a sample with a pulsed charged particle beam; an optical system to irradiate the sample with light; a detector configured to detect a secondary charged particle emitted by irradiating the sample with the pulsed charged particle beam; a control unit configured to control the charged particle optical system to irradiate the sample with the pulsed charged particle beam under a predetermined electron beam pulse condition, and control the optical system to irradiate the sample with the light under a predetermined light irradiation condition; and a computation device configured to set the predetermined light irradiation condition based on a difference between a secondary charged particle signal amount detected under a first electron beam pulse condition and a secondary charged particle signal amount detected under a second electron beam pulse condition different from the first electron beam pulse condition.

9 Claims, 18 Drawing Sheets

(51) Int. Cl.
*H01J 37/244* (2006.01)
*H01J 37/28* (2006.01)

(58) Field of Classification Search
CPC .... H01J 37/28; H01J 37/22; H01J 2237/2448;
H01J 2237/24564; G01N 23/2251; G01R
31/311; G01R 19/0061; G01R 27/02
USPC ................................. 250/306, 307, 310, 311
See application file for complete search history.

(56) References Cited

U.S. PATENT DOCUMENTS

| | | | |
|---|---|---|---|
| 2014/0097342 A1 | 4/2014 | Tsuno et al. | |
| 2018/0182596 A1 | 6/2018 | Suzuki | |
| 2021/0066028 A1* | 3/2021 | Shirasaki | .............. H01J 37/226 |

FOREIGN PATENT DOCUMENTS

| | | | |
|---|---|---|---|
| JP | 2008-130582 A | 6/2008 | |
| JP | 2012-252913 A | 12/2012 | |
| JP | 2015-135833 A | 7/2015 | |
| KR | 10-2018-0073436 A | 7/2018 | |

OTHER PUBLICATIONS

Korean Office Action received in corresponding Korean Application
No. 10-2023-7012463 dated Jun. 21, 2024.

\* cited by examiner

[FIG. 1]
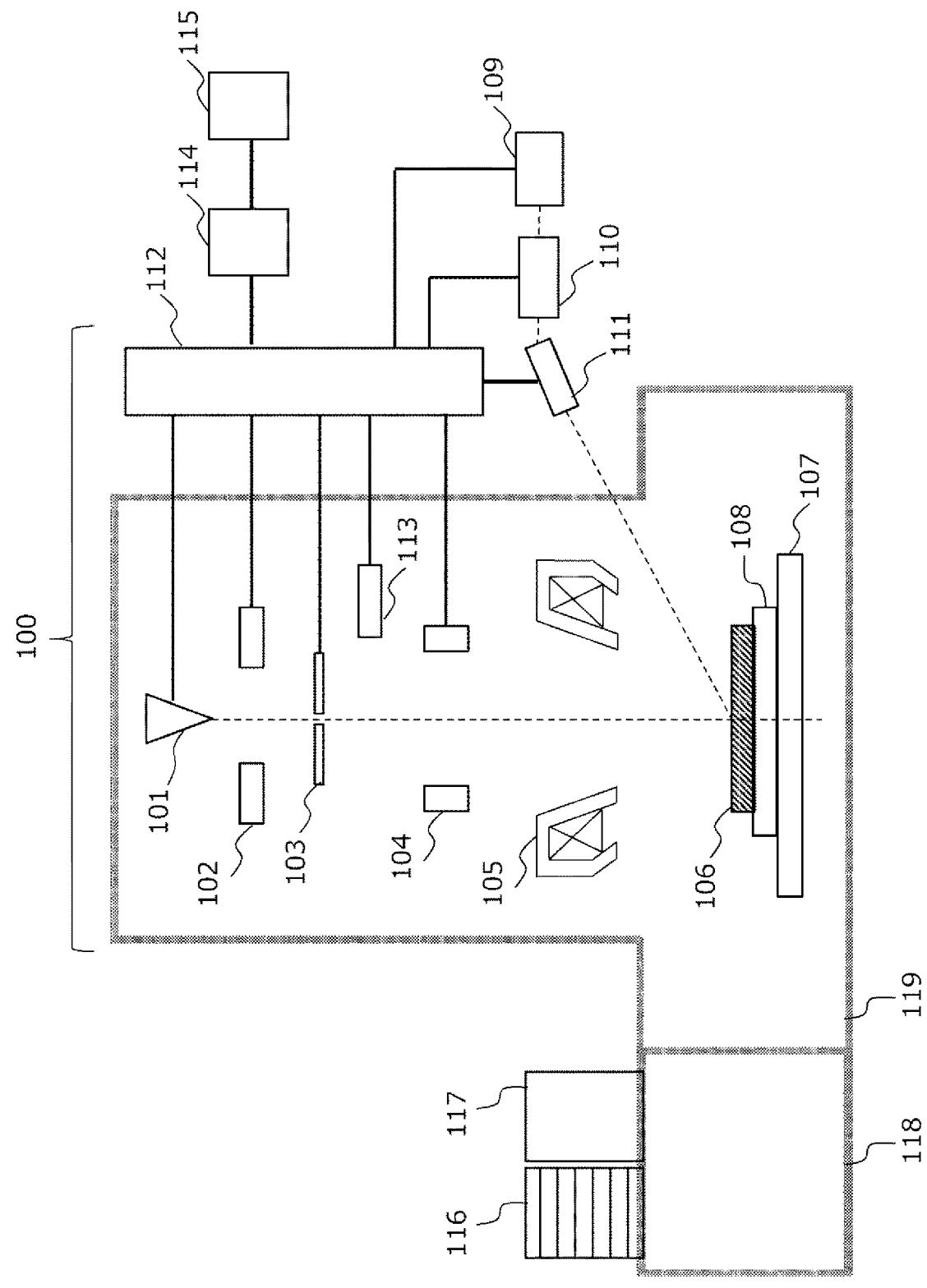

[FIG. 2A]
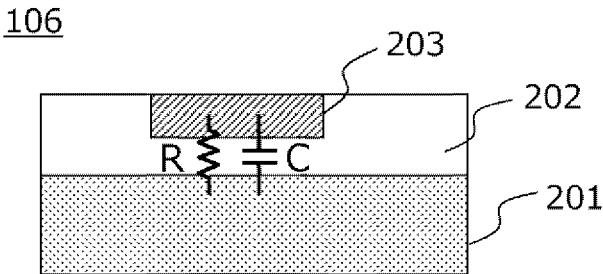

[FIG. 2B]
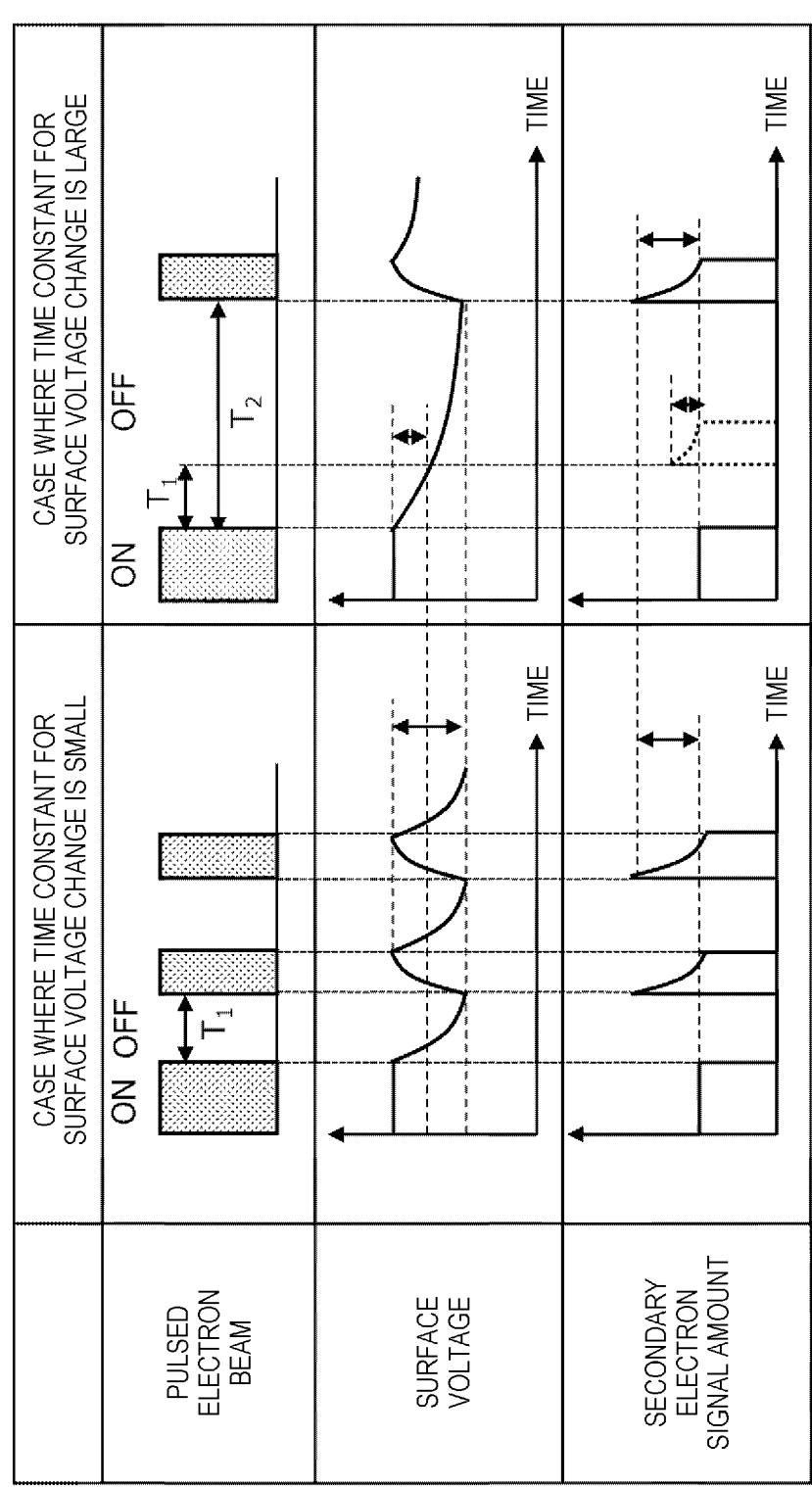

[FIG. 3]
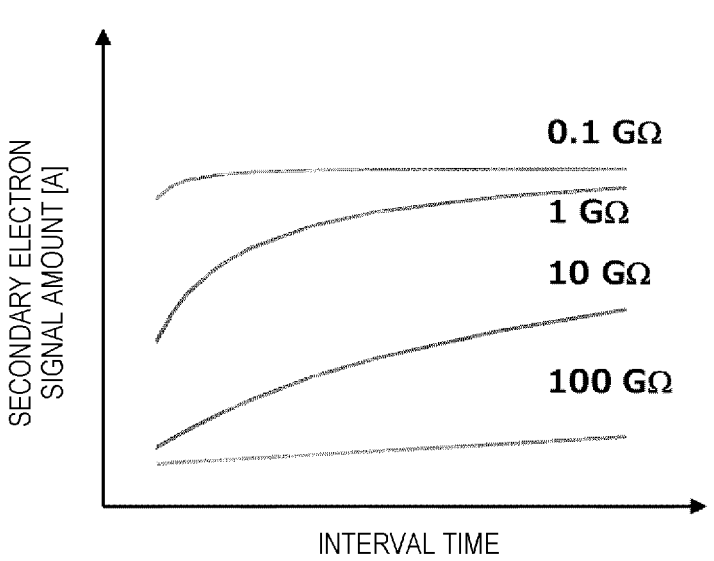

[FIG. 4A]

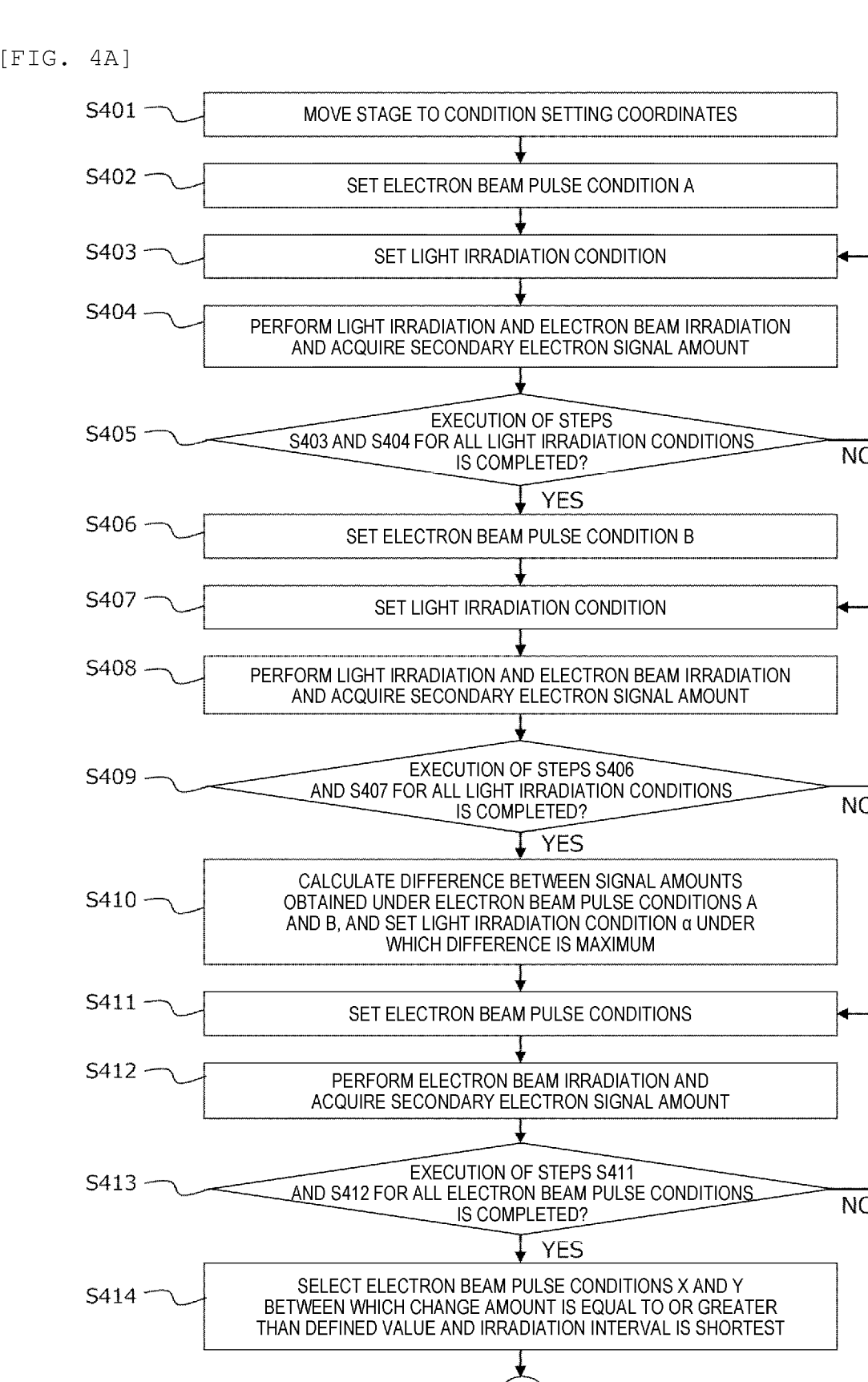

S401 — MOVE STAGE TO CONDITION SETTING COORDINATES

S402 — SET ELECTRON BEAM PULSE CONDITION A

S403 — SET LIGHT IRRADIATION CONDITION

S404 — PERFORM LIGHT IRRADIATION AND ELECTRON BEAM IRRADIATION AND ACQUIRE SECONDARY ELECTRON SIGNAL AMOUNT

S405 — EXECUTION OF STEPS S403 AND S404 FOR ALL LIGHT IRRADIATION CONDITIONS IS COMPLETED?    NO

YES

S406 — SET ELECTRON BEAM PULSE CONDITION B

S407 — SET LIGHT IRRADIATION CONDITION

S408 — PERFORM LIGHT IRRADIATION AND ELECTRON BEAM IRRADIATION AND ACQUIRE SECONDARY ELECTRON SIGNAL AMOUNT

S409 — EXECUTION OF STEPS S406 AND S407 FOR ALL LIGHT IRRADIATION CONDITIONS IS COMPLETED?    NO

YES

S410 — CALCULATE DIFFERENCE BETWEEN SIGNAL AMOUNTS OBTAINED UNDER ELECTRON BEAM PULSE CONDITIONS A AND B, AND SET LIGHT IRRADIATION CONDITION α UNDER WHICH DIFFERENCE IS MAXIMUM

S411 — SET ELECTRON BEAM PULSE CONDITIONS

S412 — PERFORM ELECTRON BEAM IRRADIATION AND ACQUIRE SECONDARY ELECTRON SIGNAL AMOUNT

S413 — EXECUTION OF STEPS S411 AND S412 FOR ALL ELECTRON BEAM PULSE CONDITIONS IS COMPLETED?    NO

YES

S414 — SELECT ELECTRON BEAM PULSE CONDITIONS X AND Y BETWEEN WHICH CHANGE AMOUNT IS EQUAL TO OR GREATER THAN DEFINED VALUE AND IRRADIATION INTERVAL IS SHORTEST

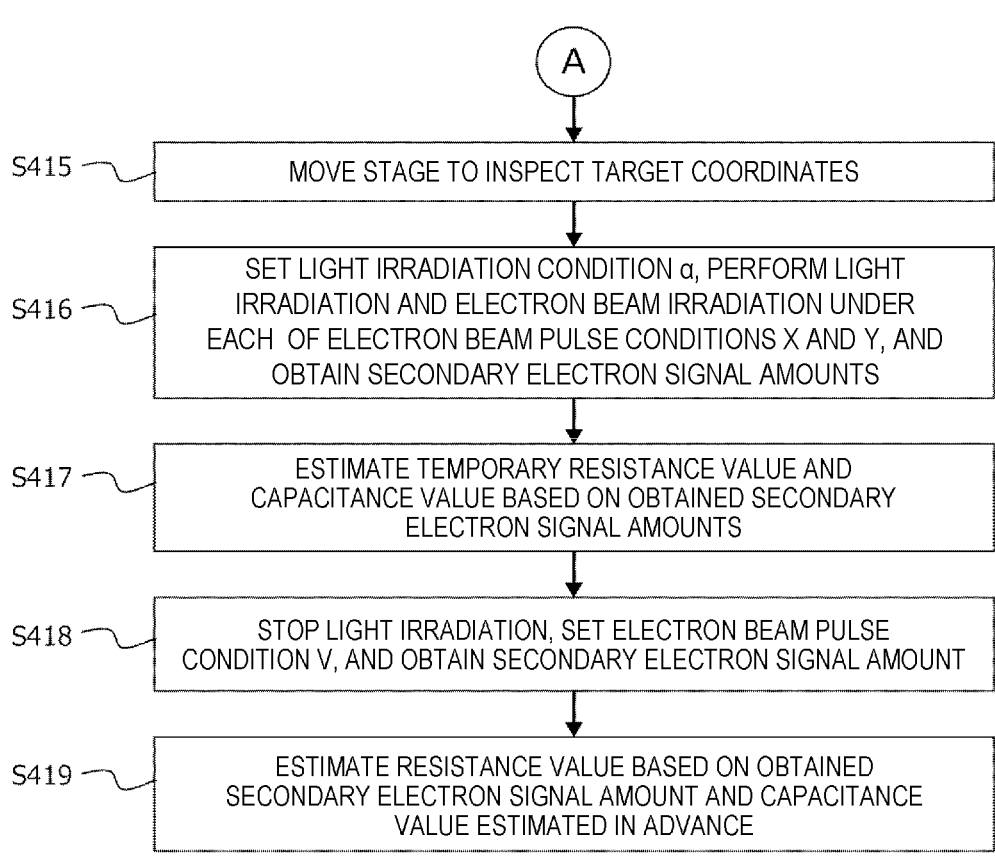

S415    MOVE STAGE TO INSPECT TARGET COORDINATES

S416    SET LIGHT IRRADIATION CONDITION α, PERFORM LIGHT IRRADIATION AND ELECTRON BEAM IRRADIATION UNDER EACH OF ELECTRON BEAM PULSE CONDITIONS X AND Y, AND OBTAIN SECONDARY ELECTRON SIGNAL AMOUNTS

S417    ESTIMATE TEMPORARY RESISTANCE VALUE AND CAPACITANCE VALUE BASED ON OBTAINED SECONDARY ELECTRON SIGNAL AMOUNTS

S418    STOP LIGHT IRRADIATION, SET ELECTRON BEAM PULSE CONDITION V, AND OBTAIN SECONDARY ELECTRON SIGNAL AMOUNT

S419    ESTIMATE RESISTANCE VALUE BASED ON OBTAINED SECONDARY ELECTRON SIGNAL AMOUNT AND CAPACITANCE VALUE ESTIMATED IN ADVANCE

[FIG. 5A]

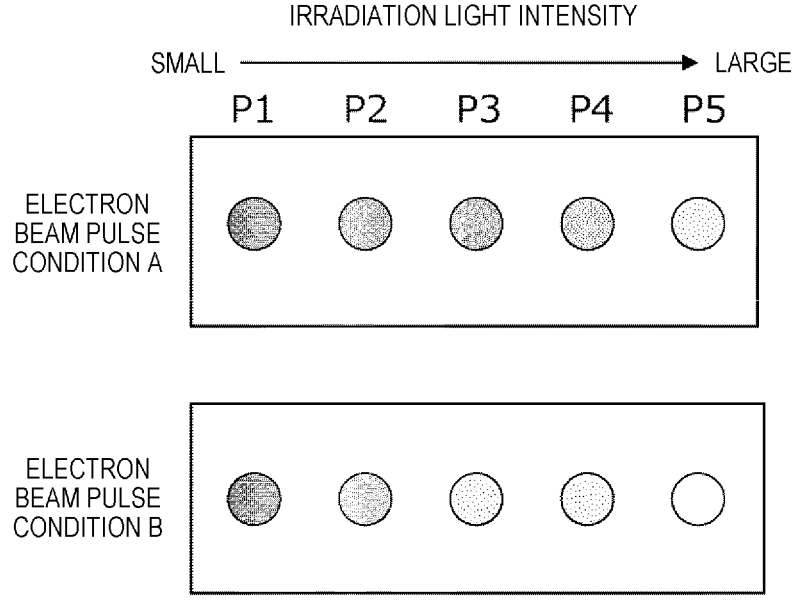

IRRADIATION LIGHT INTENSITY

SMALL ⟶ LARGE

P1   P2   P3   P4   P5

ELECTRON BEAM PULSE CONDITION A

ELECTRON BEAM PULSE CONDITION B

[FIG. 5B]
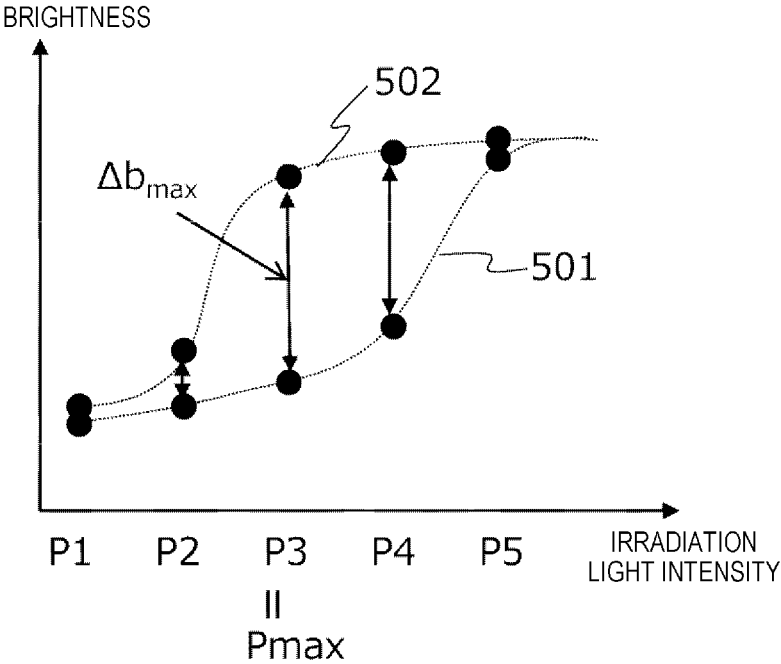
[FIG. 6]
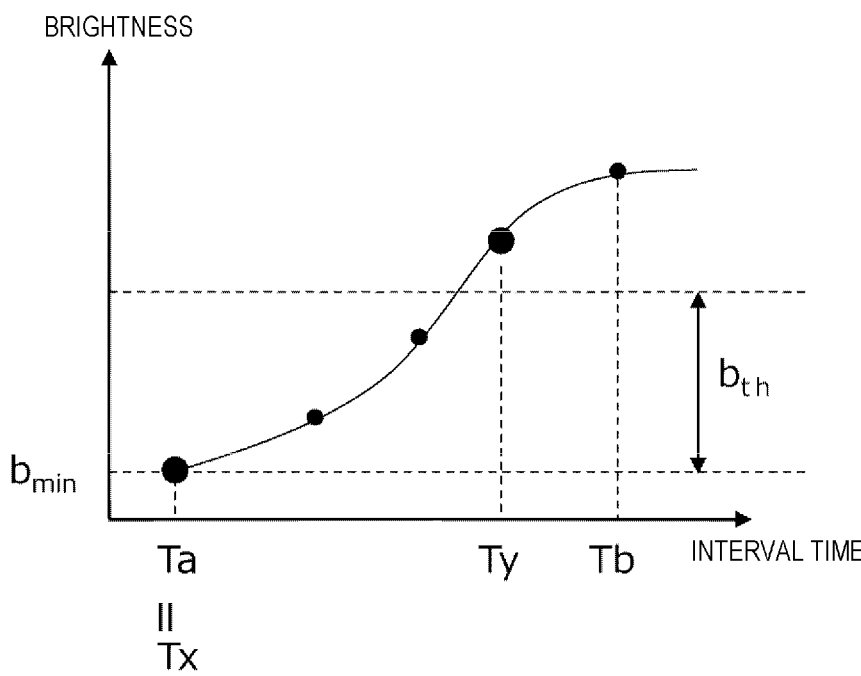

[FIG. 7]
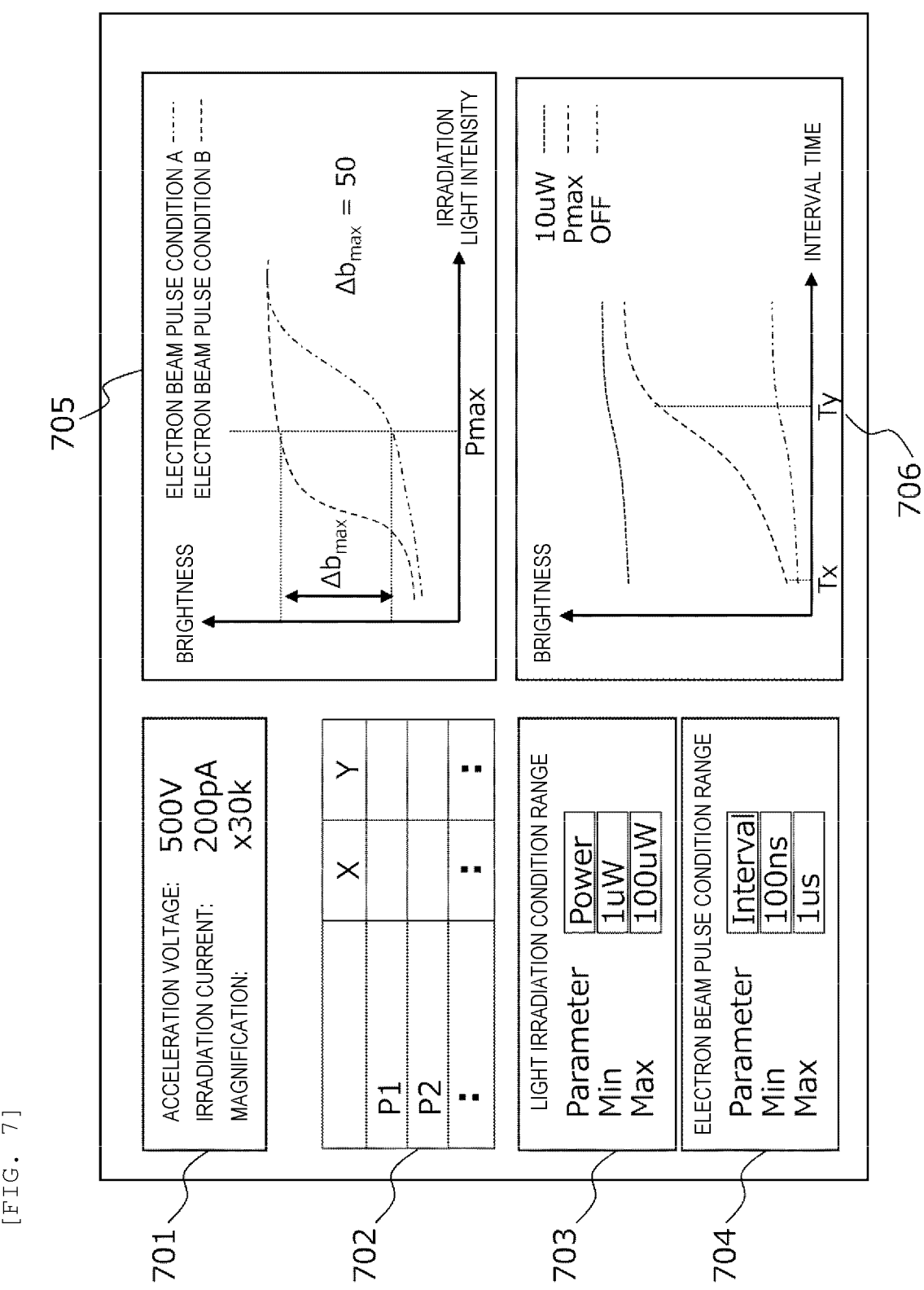

[FIG. 8A]
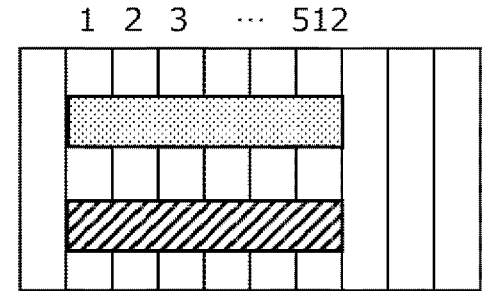
[FIG. 8B]
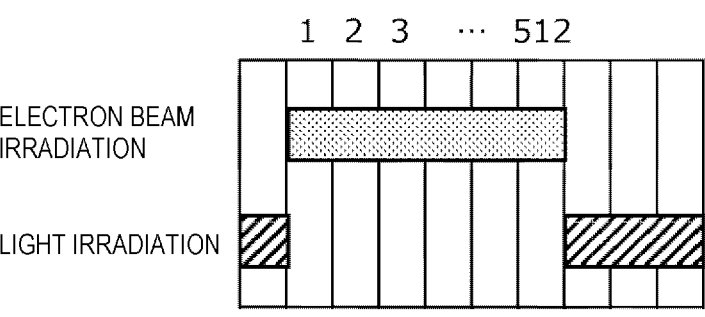
[FIG. 8C]
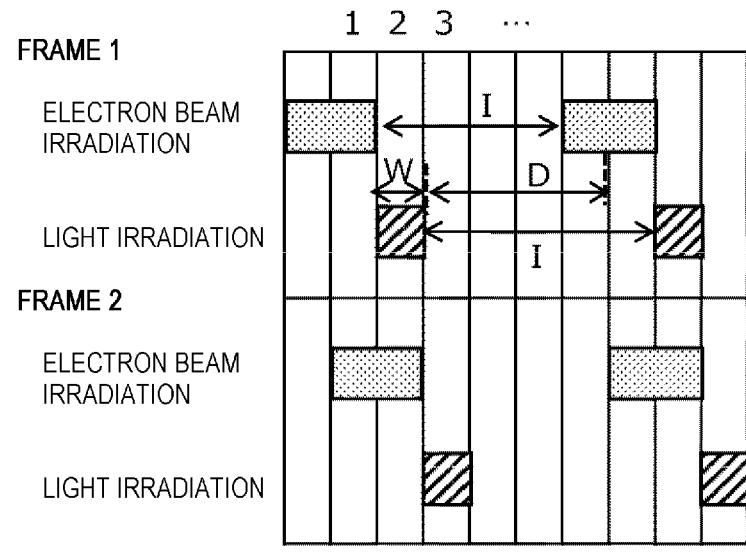

[FIG. 8D]
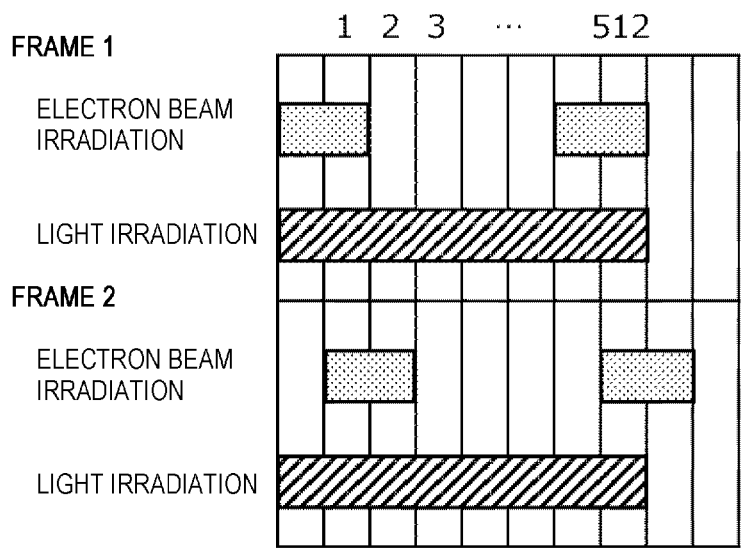
[FIG. 8E]
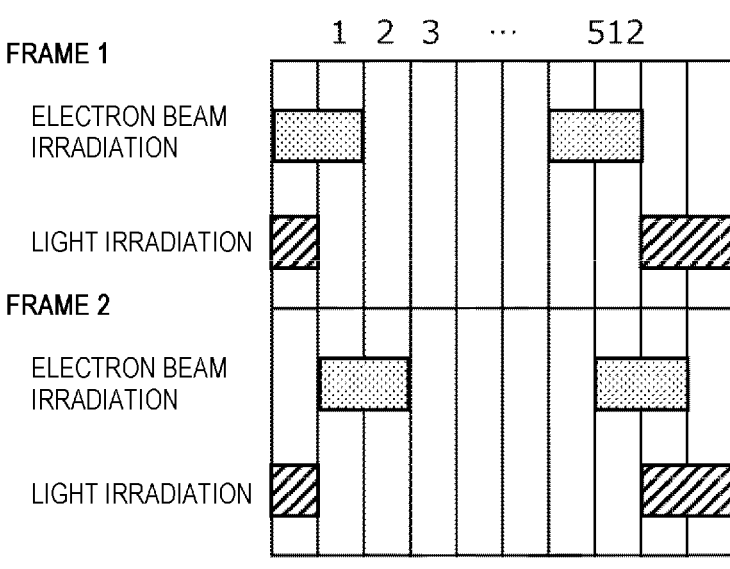

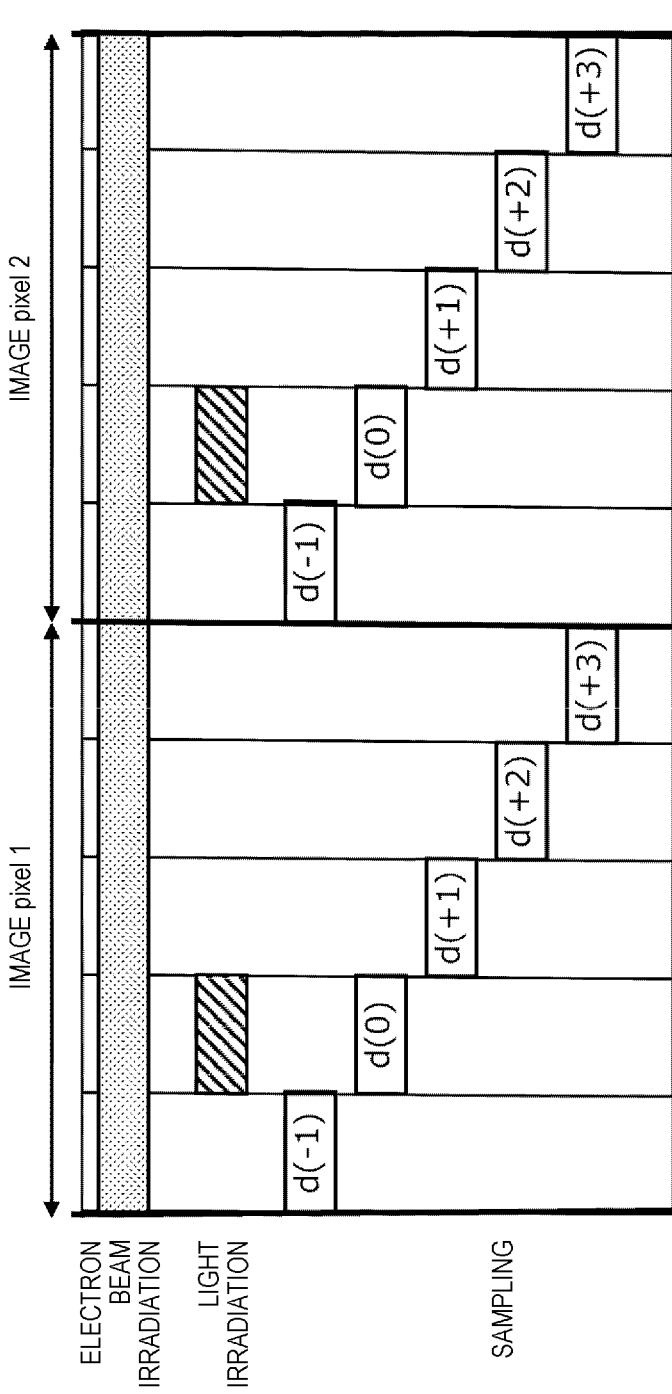
[FIG. 8F]

[FIG. 9]
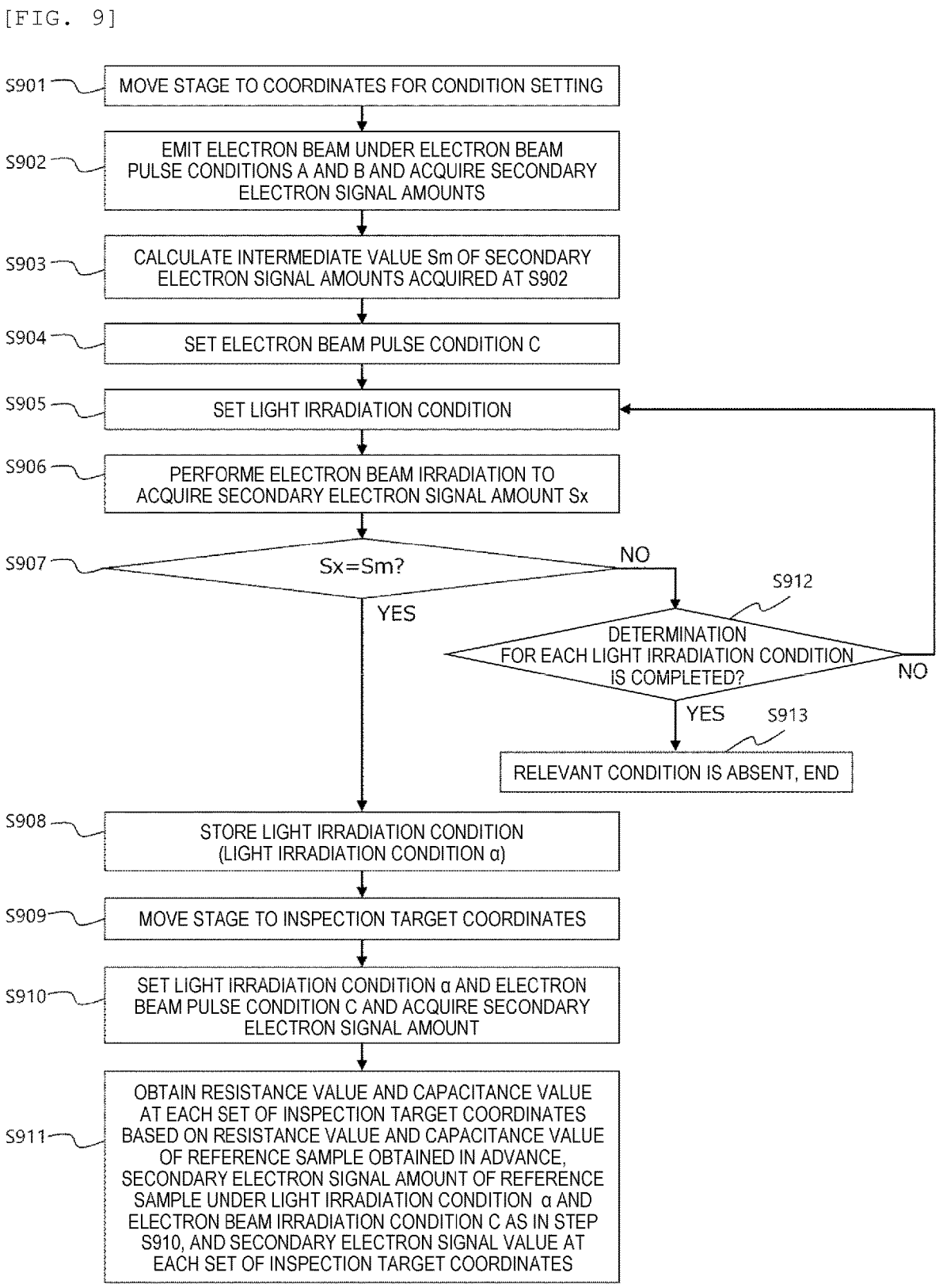

[FIG. 10]
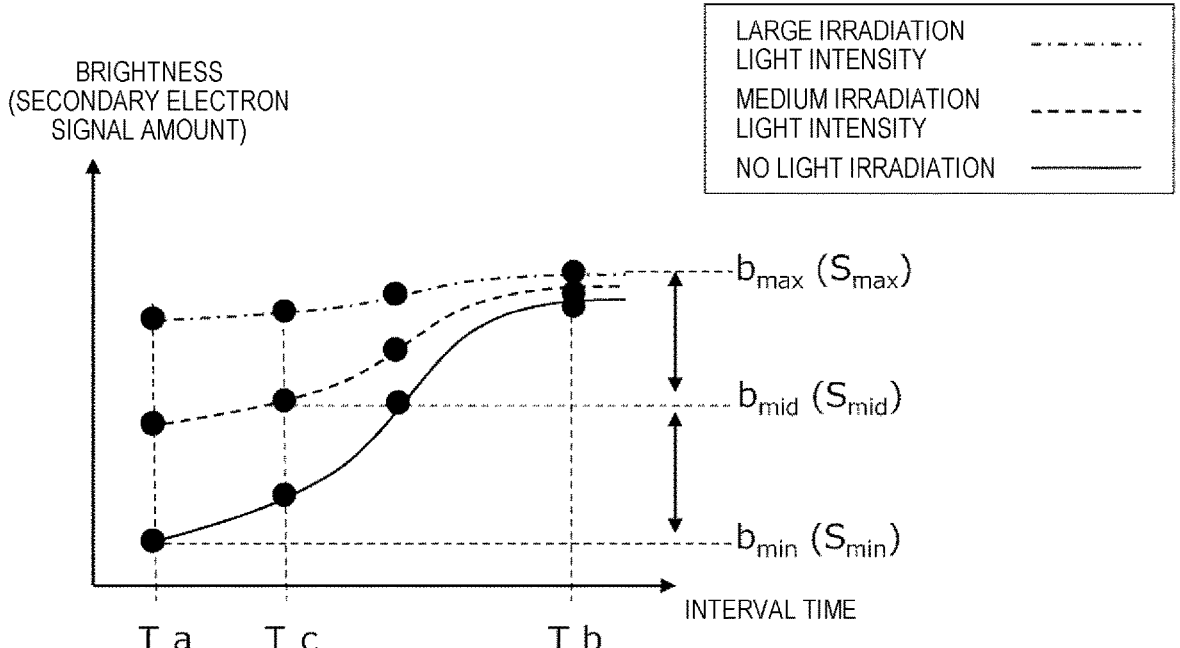

[FIG. 11]

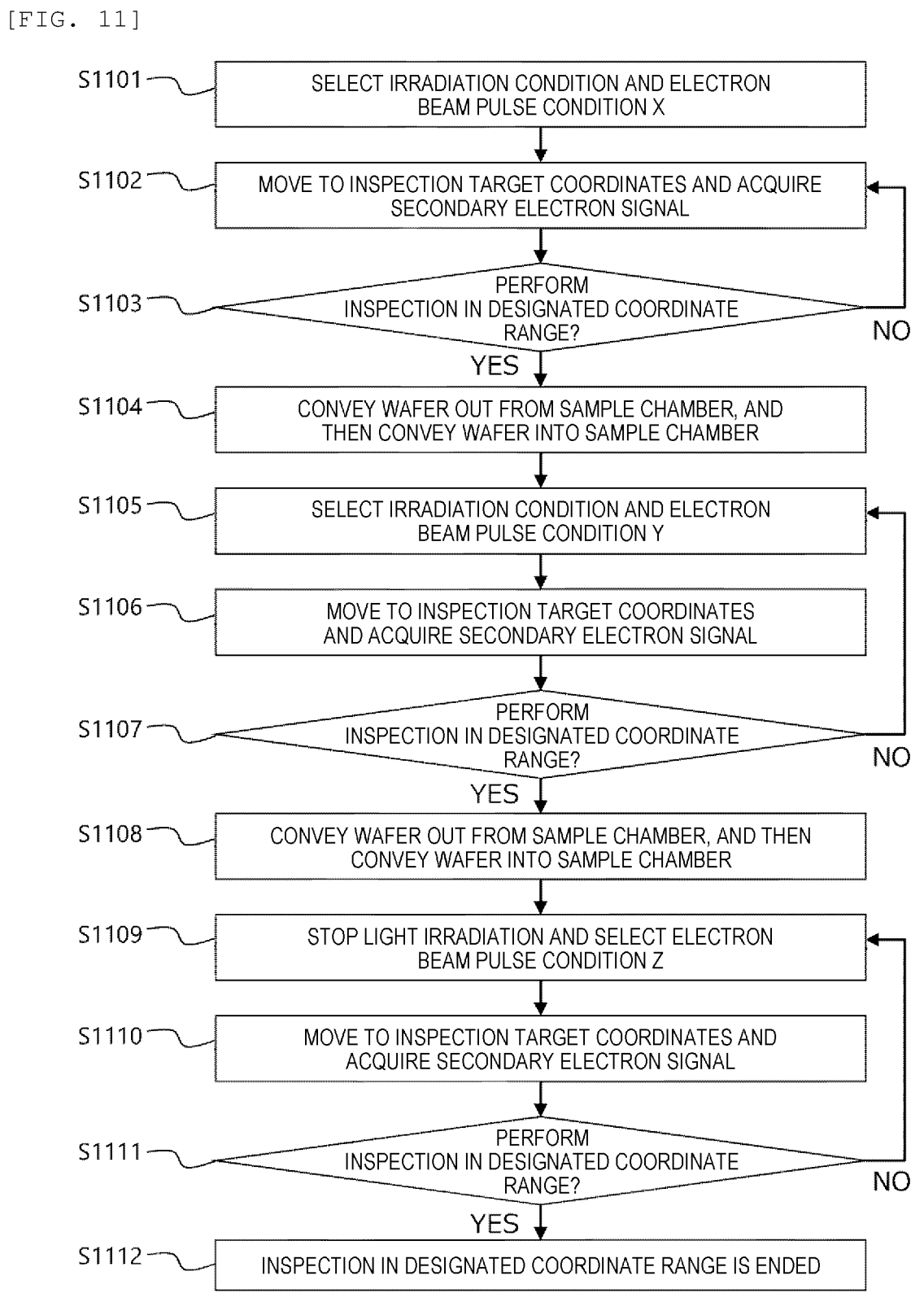

S1101 — SELECT IRRADIATION CONDITION AND ELECTRON BEAM PULSE CONDITION X

S1102 — MOVE TO INSPECTION TARGET COORDINATES AND ACQUIRE SECONDARY ELECTRON SIGNAL

S1103 — PERFORM INSPECTION IN DESIGNATED COORDINATE RANGE?     NO

YES

S1104 — CONVEY WAFER OUT FROM SAMPLE CHAMBER, AND THEN CONVEY WAFER INTO SAMPLE CHAMBER

S1105 — SELECT IRRADIATION CONDITION AND ELECTRON BEAM PULSE CONDITION Y

S1106 — MOVE TO INSPECTION TARGET COORDINATES AND ACQUIRE SECONDARY ELECTRON SIGNAL

S1107 — PERFORM INSPECTION IN DESIGNATED COORDINATE RANGE?     NO

YES

S1108 — CONVEY WAFER OUT FROM SAMPLE CHAMBER, AND THEN CONVEY WAFER INTO SAMPLE CHAMBER

S1109 — STOP LIGHT IRRADIATION AND SELECT ELECTRON BEAM PULSE CONDITION Z

S1110 — MOVE TO INSPECTION TARGET COORDINATES AND ACQUIRE SECONDARY ELECTRON SIGNAL

S1111 — PERFORM INSPECTION IN DESIGNATED COORDINATE RANGE?     NO

YES

S1112 — INSPECTION IN DESIGNATED COORDINATE RANGE IS ENDED

[FIG. 12A]
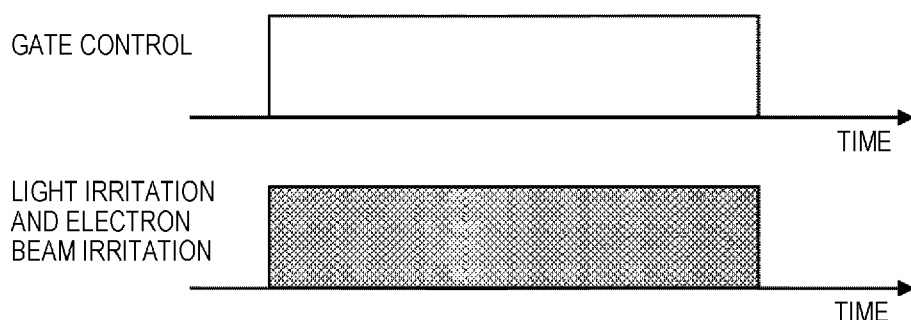
[FIG. 12B]
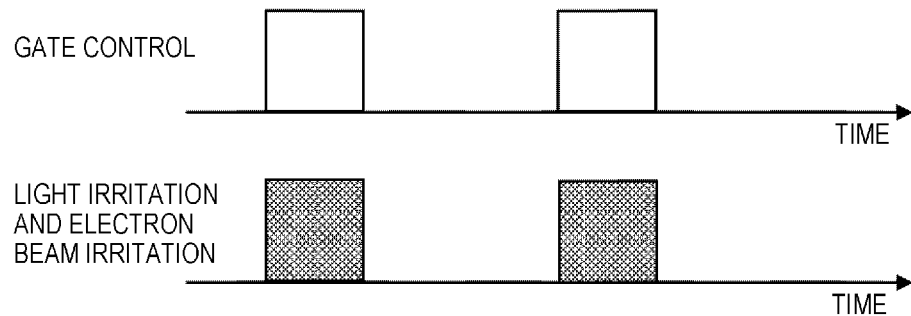
[FIG. 12C]
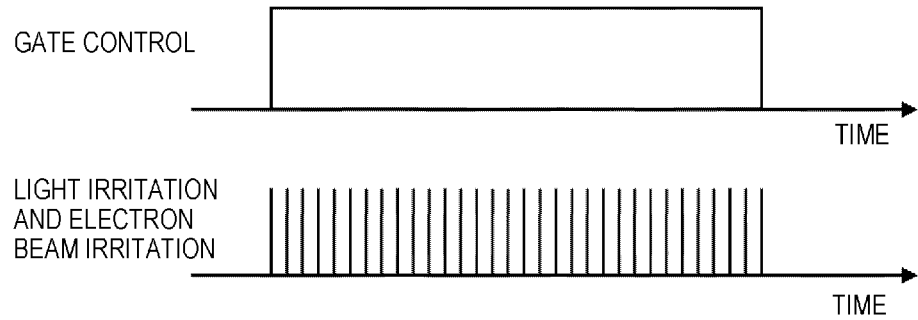

[FIG. 12D]
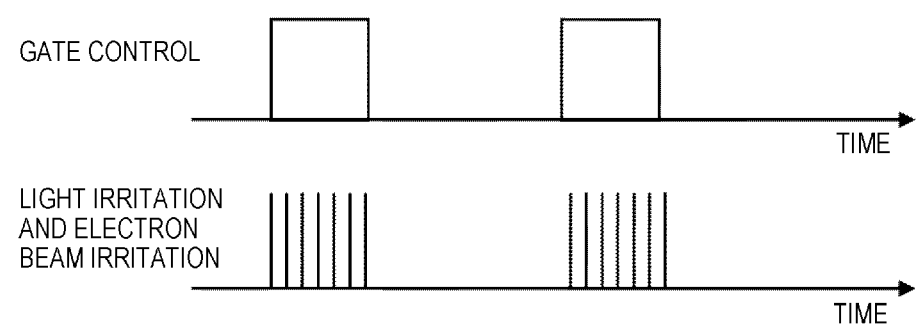
[FIG. 13A]
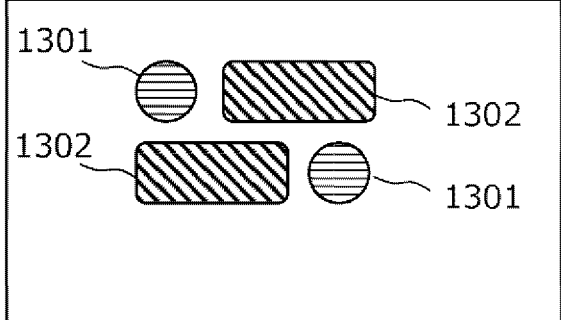
[FIG. 13B]
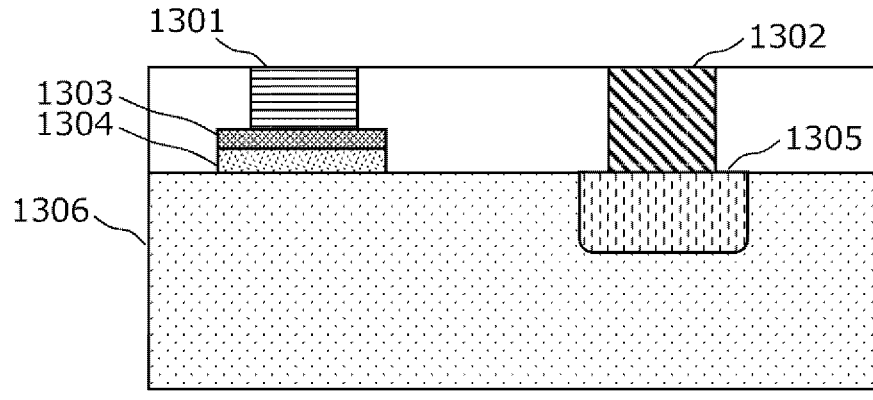

[FIG. 14A]
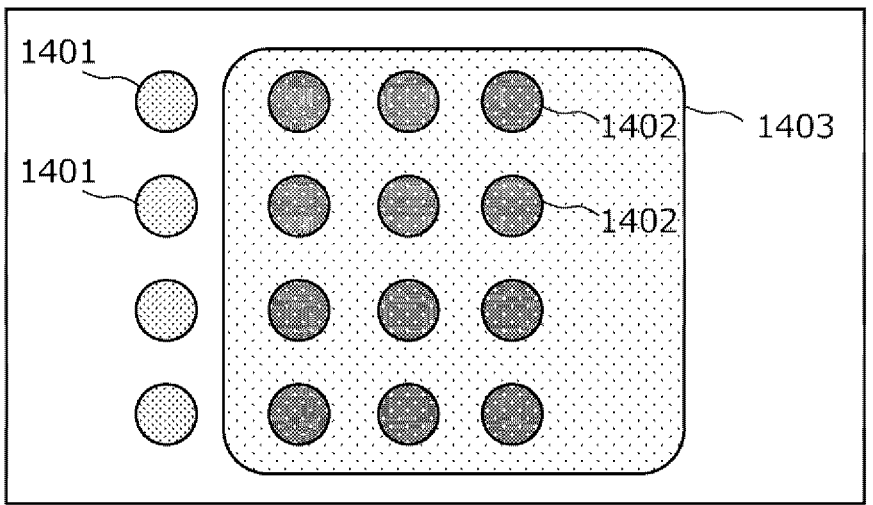
[FIG. 14B]
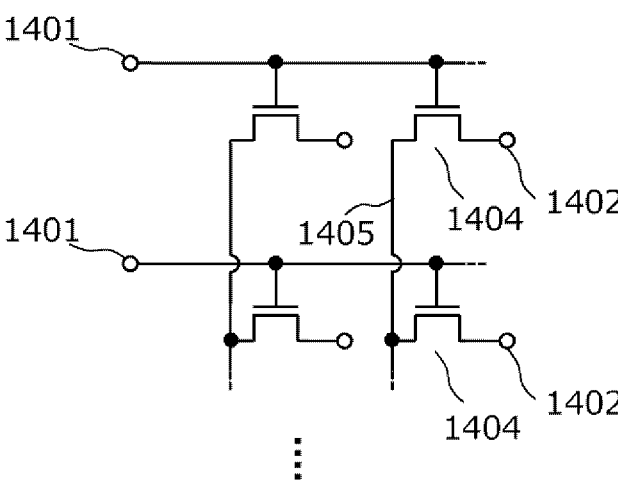

[FIG. 15A]
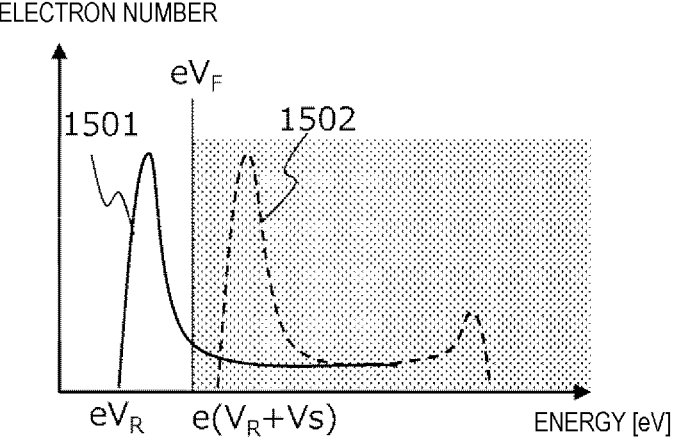
[FIG. 15B]
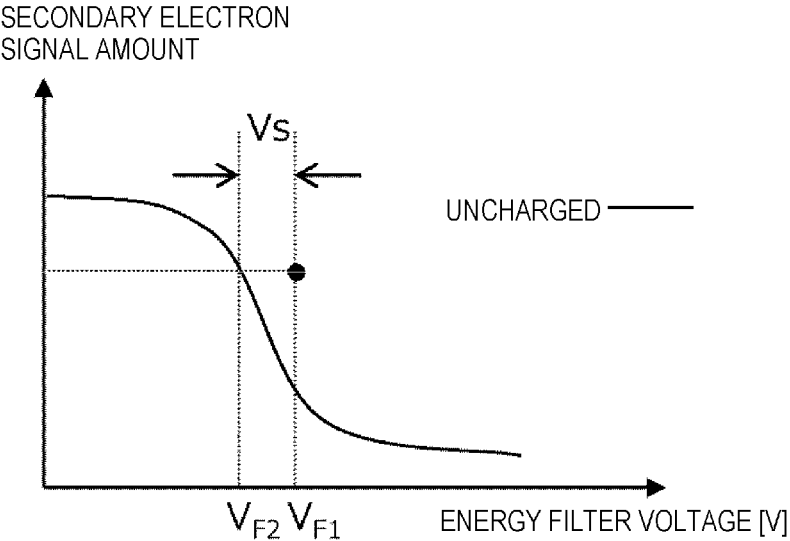

CHARGED PARTICLE BEAM APPARATUS

TECHNICAL FIELD

The present invention relates to charged particle beam apparatus.

BACKGROUND ART

As one of sample analysis methods using an electron microscope, a method is known in which a voltage contrast image is formed based on detection of secondary electrons or the like obtained by irradiating a sample with an electron beam, and electrical characteristics of an element formed on the sample are evaluated based on the analysis of the voltage contrast image.

For example, PTL 1 discloses a method of determining a defect by calculating an electrical resistance value based on voltage contrast. In addition, PTL 2 discloses a method of accurately predicting defect characteristics such as an electrical resistance value by creating a netlist, which describes information including electrical characteristics and connection information of a circuit element based on voltage contrast, as an equivalent circuit.

PTL 3 discloses that a temporal change in a charge amount can be captured by controlling a timing of pulsing an electron beam and a timing of sampling secondary electrons emitted from a sample in synchronization with the pulsing timing of the electron beam.

PTL 4 discloses that even when an insulating film surface becomes conductive and an abnormal charge is formed on the insulating film surface, by irradiating a sample with ultraviolet light, the abnormal charge is alleviated and a surface voltage can be stabilized.

CITATION LIST

Patent Literature

PTL 1: JP2003-100823A
PTL 2: JP2008-130582A
PTL 3: JP2012-252913A
PTL 4: JP2003-151483A

SUMMARY OF INVENTION

Technical Problem

PTLs 1 and 2 disclose a method of estimating a resistance value of a sample using voltage contrast. However, in order to estimate a capacitance characteristic of the sample, information on a temporal change in a charge amount (transient response) is required instead of a charge amount at a certain time point (steady state) associated with electron beam irradiation. Therefore, an observation method as disclosed in PTL 3 is effective. However, when observing such a temporal change, if the sample has a high resistance, time required for the charge amount to change becomes longer, and therefore imaging time required to obtain an image showing sufficient contrast increases.

Here, as disclosed in PTL 4, if the resistance value can be reduced by irradiating the sample with light such as ultraviolet rays, the imaging time can be shortened. However, when the resistance value is remarkably lowered by the light irradiation, the charge amount changes in a fairly short period of time, making it impossible to grasp the temporal change.

The invention is made in view of the above circumstances, and an object thereof is to provide charged particle beam apparatus that is capable of estimating electrical characteristics of a sample, including a capacitance characteristic, at a high speed.

Solution to Problem

Outlines of representative embodiments among embodiments disclosed in the present application will be briefly described as follows.

Charged particle beam apparatus according to an embodiment of the invention includes: a charged particle optical system configured to irradiate a sample with a pulsed charged particle beam; an optical system configured to irradiate the sample with light; a detector configured to detect a secondary charged particle emitted by irradiating the sample with the pulsed charged particle beam; a control unit configured to control the charged particle optical system to irradiate the sample with the pulsed charged particle beam under a predetermined electron beam pulse condition, and control the optical system to irradiate the sample with the light under a predetermined light irradiation condition; and a computation device configured to set the predetermined electron beam pulse condition and the predetermined light irradiation condition. The computation device sets any one of a plurality of light irradiation conditions as the predetermined light irradiation condition based on a difference between a secondary charged particle signal amount detected by the detector by irradiating the sample with the light under the plurality of light irradiation conditions and irradiating the sample with the pulsed charged particle beam under a first electron beam pulse condition and a secondary charged particle signal amount detected by the detector by irradiating the sample with the light under the plurality of light irradiation conditions and irradiating the sample with the pulsed charged particle beam under a second electron beam pulse condition different from the first electron beam pulse condition.

In addition, charged particle beam apparatus according to another embodiment of the invention includes: a charged particle optical system configured to irradiate a sample with a pulsed charged particle beam; an optical system configured to irradiate the sample with light; a detector configured to detect a secondary charged particle emitted by irradiating the sample with the pulsed charged particle beam; a control unit configured to control the charged particle optical system to irradiate the sample with the pulsed charged particle beam under a predetermined electron beam pulse condition, and control the optical system to irradiate the sample with the light under a predetermined light irradiation condition; and a computation device configured to set the predetermined electron beam pulse condition and the predetermined light irradiation condition. The computation device obtains an intermediate value between a first secondary charged particle signal amount detected by the detector by irradiating the sample with the pulsed charged particle beam under a first electron beam pulse condition without irradiating the sample with the light and a second secondary charged particle signal amount detected by the detector by irradiating the sample with the pulsed charged particle beam under a second electron beam pulse condition having longer interval time than the first electron beam pulse condition, the interval time being non-radiation time of the pulsed charged particle beam, without irradiating the sample with the light, sets, as the predetermined light irradiation condition, a light irradiation condition under which a secondary charged particle signal amount detected by the detector by irradiating the sample with the light and irradiating the sample with the pulsed charged particle beam under any electron beam pulse condition corresponds to the intermediate value, and sets, as the predetermined electron beam pulse condition, the any electron beam pulse condition when the predetermined light irradiation condition is set.

Advantageous Effects of Invention

Charged particle beam apparatus that is capable of estimating and inspecting electrical characteristics of a sample, including a capacitance characteristic and a resistance characteristic, at a high speed is provided.

Other problems and novel features will become apparent from a description of the present specification and the accompanying drawings.

BRIEF DESCRIPTION OF DRAWINGS

FIG. 1 is a diagram showing a configuration example of charged particle beam apparatus.

FIG. 2A is a diagram showing sample charging transient response due to electron beam irradiation and light irradiation.

FIG. 2B is a diagram showing the sample charging transient response due to the electron beam irradiation and light irradiation.

FIG. 3 is a diagram showing a problem of the invention.

FIG. 4A shows an inspection execution flow in an Embodiment 1.

FIG. 4B shows the inspection execution flow in the Embodiment 1.

FIG. 5A is a diagram showing dependence of brightness on irradiation light intensity.

FIG. 5B is a diagram showing the dependence of the brightness on the irradiation light intensity.

FIG. 6 is a diagram showing dependence of brightness on interval time.

FIG. 7 shows an example of a GUI.

FIG. 8A shows an example of a time relationship between electron beam irradiation and light irradiation during electron beam scanning.

FIG. 8B shows an example of the time relationship between electron beam irradiation and light irradiation during electron beam scanning.

FIG. 8C shows an example of the time relationship between electron beam irradiation and light irradiation during electron beam scanning.

FIG. 8D shows an example of the time relationship between electron beam irradiation and light irradiation during electron beam scanning.

FIG. 8E shows an example of the time relationship between electron beam irradiation and light irradiation during electron beam scanning.

FIG. 8F shows an example of a time relationship between electron beam irradiation, light irradiation, and sampling during electron beam scanning.

FIG. 9 shows an inspection execution flow in an Embodiment 2.

FIG. 10 is a diagram showing dependence of brightness on interval time.

FIG. 11 shows a modification of the inspection execution flow.

FIG. 12A shows an example of electron beam gate control or light gate control.

FIG. 12B shows an example of electron beam gate control or light gate control.

FIG. 12C shows an example of electron beam gate control or light gate control.

FIG. 12D shows an example of electron beam gate control or light gate control.

FIG. 13A shows an example of a sample (plan view).

FIG. 13B shows an example of the sample (cross-sectional view).

FIG. 14A shows an example of a sample (plan view).

FIG. 14B shows an example of the sample (circuit diagram).

FIG. 15A is a diagram showing a method of measuring a charge amount of a sample.

FIG. 15B is a diagram showing the method of measuring the charge amount of the sample.

DESCRIPTION OF EMBODIMENTS

In the following embodiments, when a number and the like (including the number, a numeric value, an amount, a range, and the like) of an element is referred to, the number is not limited to a specific number, and may be equal to or greater than or equal to or less than the specific number, unless otherwise specified or unless the specific number is clearly limited to the specific number in principle. In addition, a constituent element (also including an element step and the like) is not necessary unless otherwise specified or considered to be obviously necessary in principle. Similarly, when a shape, a positional relationship, and the like of a constituent element and the like are referred to, those substantially approximate or similar to the shape and the like are included, unless otherwise specified or except the case where it is considered that the shape and the like is obviously not right in principle. The same applies to the numerical value, the range, and the like.

Hereinafter, embodiments of the invention will be described in detail with reference to the drawings. In all the drawings for describing the embodiments, the same components are denoted by the same reference numerals in principle, and repeated description thereof is omitted.

FIG. 1 shows a configuration example of charged particle beam apparatus. An electron microscope main body 100 includes, as main components thereof, a light irradiation system that irradiates a sample with light in addition to elements constituting a general electron microscope such as an electron optical system, a stage mechanism system, a control system, a signal analysis system, and an image processing system.

The electron optical system includes an electron gun 101 serving as a charged particle source, a blanker 102, an aperture 103, a deflector 104, and an objective lens 105. Electrons emitted from the electron gun 101 are pulsed by the blanker 102 and the aperture 103 and focused on a sample 106 by the objective lens 105. A pulsed electron beam is two-dimensionally radiated over the sample 106 by the deflector 104.

The stage mechanism system includes a stage 107 that is movable along XYZ axes and a sample table 108 on the stage 107, and the sample 106 is provided on the sample table 108. In addition, although not shown, a retarding power supply that applies a voltage to the sample 106 may be connected.

The light irradiation system includes a light source 109, a light path breaker 110, and a light path 111. Continuous light or pulsed light emitted from the light source 109 is gated by the light path breaker 110, thereby controlling irradiation to the sample 106. The light from the light source 109 is focused onto the sample 106 by the light path 111. The light path 111 may include general optical elements such as a mirror, a lens, a splitter, and optical fibers.

A control device 112 is connected to the electron optical system to control an acceleration voltage and an irradiation current of the electron beam and to control a deflection position of the electron beam, and is connected to the light irradiation system to control a wavelength and intensity of the light and to control a focus position of the light. In addition, the control device 112 is connected to the blanker 102, the light path breaker 110, and a detector 113, and controls synchronization of an electron beam pulsing timing, a light ON/OFF timing, and a secondary electron sampling timing.

A computation device 114 performs image generation, defect classification, electrical characteristic measurement, and the like based on secondary electron signals obtained by the detector 113 and the control device 112, and outputs a result to an input and output device 115. The input and output device 115 is implemented with a display, a keyboard, a mouse, a control panel-like switch, or the like, and may be a remote PC or the like via a network.

Moreover, when the sample is a semiconductor wafer, the charged particle beam apparatus may include a wafer conveying system. In this case, a wafer cassette 116 on which a wafer is provided, a wafer loader 117 that feeds the wafer into the electron microscope, a preparation chamber 118 in which the wafer is provided before being fed into the sample chamber 119, and the like are provided.

FIGS. 2A to 2B show sample charging transient response due to electron beam irradiation and light irradiation. When an electron microscope applies a constant acceleration voltage to a sample and irradiates the sample with an electron beam, secondary electrons are emitted from the sample. A secondary electron image is formed by detecting the emitted secondary electrons by the detector synchronously with scanning of the electron beam. Here, the amount of the secondary electrons emitted from the sample changes due to a current and an acceleration voltage of the electron beam incident on the sample, a material and an uneven structure of the surface of the sample, charge of the surface, or the like. Depending on the acceleration voltage, a positive charging state where the amount of the secondary electrons emitted from the sample is greater than the number of incident electrons, or adversely, a negative charging state where the amount of the secondary electrons emitted from the sample is less than the number of the incident electrons occurs. In the following description, an example of a state where positive charging occurs due to electron beam irradiation will be described, and the same also applies to a state where negative charging occurs, except that changes in a surface voltage of the sample are different.

FIG. 2A is a cross-sectional view of an example of the sample 106. An insulating film 202 is formed on a wafer substrate 201, and a floating conductor 203 is formed on the insulating film 202. The insulating film 202 is, for example, $SiO_2$ or $Si_3N_4$. At this time, an equivalent resistance R and an equivalent capacitance C as shown in this figure are present between the floating conductor 203 and the wafer substrate 201.

FIG. 2B shows changes in a surface voltage of the floating conductor 203 when the sample in FIG. 2A is irradiated with a pulsed electron beam. When the incident electron beam causes positive charging, the surface voltage of the sample increases during a pulsed electron beam irradiation period, while the surface voltage of the sample decreases during a pulsed electron beam non-radiation period because a current flows to the wafer substrate according to a time constant determined by a product of the equivalent resistance R and the equivalent capacitance C described above. In addition, when the surface voltage of the sample increases, an electric field directly above the sample changes and a potential barrier is generated, and as a result, secondary electrons having low energy among the secondary electrons once emitted from the sample are returned to the sample again. Therefore, the larger surface voltage indicates the smaller amount of the secondary electrons detected by the detector, and the smaller surface voltage indicates the larger amount of the secondary electrons detected by the detector. Contrast generated in an image due to such a surface voltage change is called voltage contrast. It is possible to indirectly capture charging changes in the sample by the voltage contrast.

FIG. 2B shows a secondary electron signal amount detected when the sample is irradiated with a pulsed electron beam in a case where the time constant for the surface voltage change is small and a case where the time constant for the surface voltage change is large. In this way, when trying to obtain the same secondary electron signal amounts in both cases, pulse non-radiation time (interval time) $T_2$ in the case where the time constant for the surface voltage change is large is longer than pulse non-radiation time $T_1$ in the case where the time constant for the surface voltage change is small. For this reason, for example, when a change in the secondary electron signal amount above a certain level is required due to time variations in an electron beam current and a secondary electron current, detector noise, or the like, for a sample whose time constant for the surface voltage change is large, it is necessary to perform inspection using a long interval time. The long interval time reduces the number of inspections per hour (inspection throughput).

Therefore, the insulating film is made conductive by irradiating a pulsed electron beam irradiation point with light having a wavelength shorter than that of an absorption edge of the insulating film (light having energy exceeding a bandgap of the insulating film). By making the insulating film conductive, the equivalent resistance R shown in FIG. 2A is decreased, and as a result, the time constant determined by the product of the equivalent resistance R and the equivalent capacitance C is decreased. In this way, by irradiating the sample with light having a predetermined wavelength and irradiating the sample with the pulsed electron beam, it is possible to obtain a large secondary electron signal amount even with a short interval time.

FIG. 3 is obtained by plotting how the secondary electron signal amount changes with the interval time using the equivalent resistance R as a parameter, with the equivalent capacitance C fixed. When the equivalent resistance R is 100 GΩ, even when the pulse interval time is increased, the secondary electron signal amount hardly changes, and when the resistance value is 10 GΩ or 1 GΩ, the secondary electron signal amount changes in a wide range according to the pulse interval time. However, when the resistance value is decreased to 0.1 GΩ, the secondary electron signal amount does not change according to the interval time again. This is because the time constant for the voltage change is fairly small, and the charging immediately converged to a steady state. When the change time constant is fairly large or fairly small, the secondary electron signal amount cannot change appropriately. Therefore, in order to avoid problems in accuracy and throughput, it is necessary to set light irradiation conditions and electron beam irradiation conditions at which an appropriate time constant is obtained.

Embodiment 1

FIGS. 4A and 4B show a flow of setting light irradiation conditions and electron beam irradiation conditions and executing inspection in an Embodiment 1. The computation device 114 executes this flow. After a sample is loaded and electron beam optical conditions such as an acceleration voltage and an irradiation current are set, the sample is moved to a position of condition setting coordinates of the sample (S401). The condition setting coordinates may be freely determined as long as a structure of the sample at these coordinates has the same structure as a structure at inspection target coordinates. Then, an electron beam pulse condition is set to a certain condition (electron beam pulse condition A). Here, as an example, the electron beam pulse condition A is interval time Ta [seconds]. Next, the light irradiation condition is set to any one within a designated range. Here, as an example, the light irradiation condition is irradiation light intensity, and the irradiation light intensity can be designated in n ways of P1, P2, . . . Pk, . . . Pn [W] (n is a natural number, and k is any one of 1 to n). In this case, the irradiation light intensity is set to Pk [W] (S403), the sample is irradiated with light and an electron beam, and a secondary electron signal S(Ta,Pk) is obtained (S404). Here, the secondary electron signal amount may be an average value obtained by scanning an inspection target structure or may be a value obtained from a certain point. Steps S403 and S404 are executed for all the light irradiation conditions P1 to Pn, and after such execution is completed (S405), a different electron beam pulse condition B is set. Here, the electron beam pulse condition B is interval time Tb [seconds] (S406). As in the case of the electron beam pulse condition A, a secondary electron signal S(Tb,Pk) is obtained for respective light irradiation conditions P1 to Pn (S407 to S409).

Next, a difference Sd(Pk) between the secondary electron signal amounts obtained under the electron beam pulse condition A and the electron beam pulse condition B is calculated for the same light irradiation condition. That is, Sd(Pk)=S(Tb,Pk)−S(Ta,Pk). Based on this calculation result, a light irradiation condition (Pmax) under which an absolute value of Sd(Pk) is maximum is set as a light irradiation condition a (S410). Next, an electron beam pulse condition is set to any one within a designated range. Here, the electron beam pulse condition is interval time, and the interval time can be designated in m ways of T1, T2, . . . Tl, . . . Tm [seconds] (m is a natural number, and l is any one of 1 to m). In this case, the interval time is set to Tl [seconds] (S411), the sample is irradiated with light and an electron beam, and a secondary electron signal S(Tl,Pmax) is obtained (S412). Steps S411 and S412 are executed for all the interval times T1 to Tm (S413). Next, a difference {S(Tl$_1$,Pmax)−S(Tl$_2$, Pmax)} is calculated for two different interval times Tl$_1$ and Tl$_2$, and the interval times Tl$_1$ and Tl$_2$ whose difference is equal to or greater than a predetermined threshold value and whose sum (Tl$_1$+Tl$_2$) is minimum, are obtained and set as electron beam pulse conditions X and Y, respectively (S414). Here, the electron beam pulse conditions X and Y are interval times Tx and Ty [seconds], respectively.

Next, the stage is moved to the inspection target coordinates (S415), and secondary electron signals S(Tx, Pmax) and S(Ty, Pmax) for each set of inspection coordinates are obtained under the light irradiation condition a and the electron beam pulse conditions X and Y (S416). Here, the charged particle beam apparatus holds a database about relationships between a secondary electron signal S, which is obtained by simulation or obtained by a similar sample in advance, and the resistance value and the capacitance value of the sample. For example, the database holds, for a sample having a predetermined structure, information about dependence of the secondary electron signal amount on the interval time with the equivalent resistance R as a parameter, as shown in FIG. 3, for each equivalent capacitance C. When a condition other than the interval time is controlled as the electron beam pulse condition, a database that holds information about dependence of the secondary electron signal amount on this condition is held.

By referring to such a database, a resistance value and a capacitance value that provide S(Tx, Pmax) and S(Ty, Pmax) are estimated and set as a temporary resistance value and a capacitance value of the inspection target (S417). Here, a reason why the resistance value is called "temporary resistance value" is that the resistance value estimated here is a resistance value in a state where the influence of the light irradiation under the light irradiation condition a is present (a resistance value smaller than that in a state where the light irradiation is not present). There is no need to consider the influence of the light on the capacitance value.

Therefore, the light irradiation is stopped, an electron beam pulse condition V (the interval time is Tv) is set, and a secondary electron signal amount S(Tv) is acquired (S418). The resistance value in a state where the influence of light irradiation is not present is estimated, by referring to the database, based on the capacitance value obtained in step S417 and the value of the secondary electron signal amount S obtained in step S418 (S419).

Details of the steps in the flow shown in FIGS. 4A and 4B will be described below. In FIG. 5A, a secondary electron signal amount emitted from a circular pattern on the sample is displayed as brightness with changing the irradiation light intensity to P1 to P5 in steps 402 to S405 (electron beam pulse condition A) and steps S406 to S409 (electron beam pulse condition B). Under both the electron beam pulse conditions, the secondary electron signal amount increases (brightness increases) because the conductivity of the pattern increases (the resistance value decreases) and the charging decreases by increasing the irradiation light intensity, but changes are different. When plotting the horizontal axis as the irradiation light intensity and plotting the vertical axis as the brightness (secondary electron signal amount), FIG. 5B will be obtained. It can be seen that dependence 501 on the irradiation light intensity under the electron beam pulse condition A and dependence 502 on the irradiation light intensity under the electron beam pulse condition B are different. In FIG. 5B, the electron beam pulse condition B is an example in which the interval time is set longer than that of the electron beam pulse condition A (Tb>Ta), under the electron beam pulse condition B, the decrease in the surface voltage of the sample progresses more than that under the electron beam pulse condition A, and the secondary electron signal amount increases, resulting in higher brightness. The difference between the two electron beam pulse conditions is remarkable when the irradiation light intensity is moderate, and on the other hand, the resistance value is not sufficiently reduced in a range where the irradiation light intensity is weak, and the resistance value is excessively reduced in a range where the irradiation light intensity is strong, and as a result, a brightness difference between the two electron beam pulse conditions is reduced. Therefore, by calculating a brightness difference Ab obtained between these two electron beam pulse conditions, and selecting, as the light irradiation condition a, an irradiation light intensity Pmax (P3 in the example of FIG. 5B) having the largest difference (S410), it is possible to select a light irradiation condition (sensitivity maximization condition) under which a change rate of the secondary electron signal amount is maximized with respect to the change in the electron beam pulse conditions for this sample structure.

FIG. 6 is obtained by plotting the brightness (secondary electron signal amount) obtained in steps S411 to S413 on the vertical axis and the interval time on the horizontal axis. Here, since the light irradiation condition a under which the change in the brightness with respect to the change in the interval time is maximized is selected in step S410, a minimum required interval time is selected for the purpose of improving the throughput. For this reason, when interval times Tx and Ty are selected as the electron beam pulse conditions at two points with respect to a preset change amount threshold value $b_{th}$, two conditions are selected under which the difference between the brightness (secondary electron signal amounts) obtained under those conditions exceeds the change amount threshold value $b_{th}$ and the sum of the interval times (Tx+Ty) is the minimum or equal to or less than a predetermined threshold value.

In steps S411 to S414, the secondary electron signal amounts (brightness) are acquired in a round-robin manner, and two conditions satisfying the conditions described above are selected as the electron beam pulse conditions X and Y. The invention is not limited to this, and for example, it is also possible to automatically set the electron beam pulse condition (electron beam pulse condition A) having a shortest settable interval time as the electron beam pulse condition X, and select the electron beam pulse condition Y as a shortest possible interval time at which the change in the brightness exceeds the change amount threshold value $b_{th}$ for the electron beam pulse condition X. In this case, by acquiring the secondary electron signal amounts (brightness) in ascending order of the interval times, it is possible to stop parameter updating when the change in the brightness exceeds the change amount threshold value $b_{th}$, and therefore, an effect of shortening adjustment time is obtained.

By taking the distribution of the resistance values and capacitance values obtained for each set of inspection target coordinates among chips or wafers in this way, it is possible to verify manufacturing variations and quality of a device. This series of steps may be performed for all designated inspection target coordinates on the wafer, or the entire wafer may be inspected using only the electron beam pulse condition X or Y, and the light irradiation condition a and the electron beam pulse conditions X and Y may be applied only to the inspection target coordinates that show a specific secondary electron signal amount to obtain the resistance value and the capacitance value.

FIG. 7 shows an example of a GUI displayed on the input and output device 115. The GUI includes an electron optical condition input section 701, a coordinate input section 702, a light irradiation condition input section 703, an electron beam pulse condition input section 704, a light irradiation condition output section 705, and an electron beam pulse condition output section 706. The electron optical condition input section 701 is used to set the acceleration voltage of the electron beam, the irradiation current, magnification, and the like. The coordinate input section 702 is used to set the condition setting coordinates and the inspection target coordinates. The light irradiation condition input section 703 is used to input a desired light irradiation condition (irradiation light intensity, wavelength, deflection, period, or the like) and a setting range thereof when obtaining the light irradiation condition. FIG. 7 shows an example in which the light irradiation condition is set as the irradiation light intensity. The electron beam pulse condition input section 704 is used to input a desired electron beam pulse condition (interval time, light irradiation-electron beam irradiation delay time, or the like) and a setting range thereof. FIG. 7 shows an example in which the electron beam pulse condition is set as the interval time. The light irradiation condition output section 705 and the electron beam pulse condition output section 706 display results of the light irradiation and the electron beam irradiation in accordance with the settings of the light irradiation condition input section 703 and electron beam pulse condition input section 704, respectively. Inputs to the input sections 701 to 704 may be directly input on the GUI, or may be in a form of reading data stored in a text file or the like stored in advance. Outputs to the output sections 705 and 706 may be directly output as a graph on the GUI, or may be output to a file as data.

FIGS. 8A to 8F show examples of time relationships between electron beam irradiation, light irradiation, detection timings of the secondary electrons during electron beam scanning. All figures show how an electron beam irradiation point is shifted in an X-coordinate direction in pixel units in one line of electron beam irradiation. By repeating the electron beam irradiation a plurality of times while shifting the position of the electron beam irradiation point in a Y-coordinate direction, two-dimensional data can be acquired. In FIG. 8A, all pixels are irradiated with both the electron beam and the light. It is sufficient that fixed-point irradiation of the light is performed in an observation visual field by setting a spot diameter of the light to include a range in which scanning of the electron beam is performed. FIG. 8B shows an example in which the light irradiation is performed before and after the one line of electron beam irradiation, and no light irradiation is performed during the electron beam irradiation.

FIG. 8C shows an example in which the light irradiation and the electron beam irradiation are intermittently performed at certain intervals, respectively, and each interval time I, a phase (delay) relationship D, a radiation time width (duty) W, a secondary electron beam sampling timing (not shown), and the like are parameters. In this case, since the electron beam irradiation is intermittent (pulsed), each secondary electron signal amount acquired by an image pixel corresponding to an electron beam non-radiation period is zero or about a noise value, but it is possible to acquire secondary electron signal amounts for all pixels by repeatedly acquiring data by shifting a starting pixel of a subsequent frame (for example, frame 2) to a starting pixel of a preceding frame (for example, frame 1).

FIG. 8D shows an example in which only the electron beam irradiation is intermittent and the light irradiation is continuous. FIG. 8E shows an example in which the electron beam irradiation is intermittent as in FIG. 8D, while the light irradiation is performed only before and after the one line of electron beam irradiation as in FIG. 8B. FIG. 8F shows an example in which the electron beam irradiation is continuous, the light irradiation is intermittent, and sampling time offsets for acquiring each secondary electron signal with respect to light irradiation timings are used as parameters. Accordingly, it is possible to designate which period of time during the transient response to light pulse actions is captured. In this way, the electron beam pulsing condition may include a detection timing condition. Similarly, for FIGS. 8C to 8E, the sampling timing for the electron beam irradiation timing or the light irradiation timing may be designated as an adjustment parameter as one of the electron beam pulse condition and the light irradiation condition.

In FIG. 1, even though the electron beam irradiation or the light irradiation is not pulsed by gate control caused by the blanker 102 or the light path breaker 110, an electron source or the light source itself may pulse-oscillate at picoseconds or femtoseconds. FIGS. 12A to 12D show such an example. FIGS. 12A and 12B show how the electron beam or the light is radiated to the sample when the gate control is performed in a state where the electron source and light source are continuous. On the other hand, FIGS. 12C to 12D show how the gate control is performed by the blanker 102 or the light path breaker 110 when the electron source and the light source pulse-oscillate, and by the gate control, the sample is irradiated with a burst-like electron beam or burst-like light. One segment of the pulse waveforms in FIGS. 8C to 8F may be one segment of a burst waveform with continuous pulses in minute duration shown in FIG. 12D, or may be one continuous pulse waveform shown in FIG. 12B.

In addition, a process of resetting the charge state of the sample may be added when the electron beam pulse condition and the light irradiation condition are switched. For example, as shown in FIG. 11, after wafer inspection is performed by setting a certain light irradiation condition and a certain electron beam pulse condition (S1101 to S1103 and S1106 to S1107) and before setting a next light irradiation condition and a next electron beam pulse condition, charging may be reset by providing a step of conveying the wafer out from the sample chamber 119 (S1104 and S1108).

In addition, when a plurality of inspect target structures of different types are present in an inspection area, the electron beam irradiation conditions and light irradiation conditions may be obtained for each inspect target structure. FIGS. 13A and 13B show an example of a sample including gate electrodes 1301 and junction electrodes 1302, FIG. 13A is a top view, and FIG. 13B is a cross-sectional view. Each gate electrode 1301 is connected to a gate 1303, an insulating film 1304 is formed under the gate 1303 and placed on a P-type silicon substrate 1306. Each junction electrode 1302 is connected to a diffusion layer 1305 formed by N-type doping in the silicon substrate 1306. PN junction is formed at an interface between the silicon substrate 1306 and the diffusion layer 1305.

Since these two types of electrodes have different structures, wavelengths and energy of light required for discharging when these two types of electrodes are charged are different. Therefore, when inspecting the junction electrode 1302, a wavelength long enough not to affect the insulating film 1304 of the gate electrode 1301 may be selected, and when inspecting the gate electrode 1301, a short wavelength may be selected. On the other hand, even when a plurality of different types of inspect target structures are present, an average value of the overall secondary electron signal amounts or a secondary electron signal amount at a specific point may be used to set the electron beam irradiation conditions and the light irradiation conditions and inspect the inspect target structures having different structures under the same conditions.

After the irradiation conditions are determined in step S414 in FIG. 4, when the stage is moved to the inspection target coordinates in step S415, or before the condition setting in step S401 is started, a step of irradiating a specific position with an electron beam or light may be included. FIGS. 14A and 14B show an example in which the sample is a memory array, FIG. 14A is a top view, and FIG. 14B is a circuit diagram. The sample includes gate electrodes 1401, drain electrodes 1402, and a drain electrode area 1403. As shown in FIG. 14B, in each row in FIG. 14A, the gate electrode 1401 is connected to a gate of a MOS transistor 1404 that connects the drain electrode 1402 to a wire 1405. At this time, a resistance value from the drain electrode 1402 to the wire 1405 depends on the potential of the gate electrode 1401. Therefore, when the drain electrode area 1403 and each drain electrode 1402 included therein are inspect targets, by providing a step of controlling a charging voltage by irradiating in advance each gate electrode 1401 with an electron beam and light before irradiating the inspect targets with the electron beam and light, it is possible to adjust the resistance of the drain electrode 1402 with high accuracy. As a potential adjustment method, a method of irradiating the gate electrode 1401 with light and an electron beam while changing conditions such that the secondary electron signal value of the drain electrode 1402 under a certain electron beam pulse condition is a specific value may be used, and alternatively, the potential may be measured as described below, and irradiation conditions for achieving a designated potential may be obtained.

FIG. 15A shows a change in secondary electron signal amount depending on the potential of the sample when the detector 113 includes an energy filter. The secondary electron signal amount emitted when the sample is irradiated with the electron beam has distributions as shown in FIG. 15A. Here, $V_R$ is a retarding voltage applied to the sample, Vs is a surface charge voltage of the sample, and e is 1 electron volt (1 [eV]). An energy distribution 1502 of secondary electrons emitted when the sample is charged and the surface voltage of the sample becomes ($V_R$+Vs) is a distribution shifted by eVs as a whole from an energy distribution 1501 when the sample is uncharged. Here, when a voltage of the energy filter is $V_F$ [V], since only secondary electrons having energy equal to or higher than $eV_F$ [eV] are detected (shaded area in FIG. 15A), when the sample is charged, the number of secondary electrons detected changes even under the same energy filter voltage. Therefore, it is possible to plot the secondary electron signal detection amount as shown in FIG. 15B while changing the voltage $V_F$ of the energy filter in a state where the sample is uncharged, and measure the charge amount Vs as a difference between an energy filter voltage $V_{F1}$ during observation and an energy filter voltage $V_{F2}$ in the uncharged state, which gives a detected electron number equal to a detected electron number (brightness) at the energy filter voltage $V_{F1}$.

In this way, a step of preconditioning the resistance value in the inspection area by irradiating the electrodes and areas inside and outside the inspection area with the electron beam and light and adjusting the potential before starting the inspection of the inspection area, may be added.

Embodiment 2

FIG. 9 shows a flow of setting light irradiation conditions and electron beam irradiation conditions and executing inspection in an Embodiment 2. The computation device 114 executes this flow. The Embodiment 2 is a flow suitable for a case where standard electrical characteristics of an inspect target sample are specified in advance and only samples exhibiting outliers are to be detected, such as inspection in a mass production process.

After setting electron beam optical conditions such as an acceleration voltage and an irradiation current, a stage is moved to condition setting coordinates (S901). Then, under the electron beam pulse conditions A and B designated in advance (here, interval times Ta [seconds], Tb [seconds], respectively, and Ta<Tb), secondary electron signal amounts S(Ta) and S(Tb) are acquired (S902). At this time, under the condition of interval time Ta [seconds], the acquisition is performed without light irradiation, and under the condition of the interval time Tb [seconds], the light irradiation may or may not be performed. A value Sm(Ta, Tb) is obtained, which is an average value of the two points S(Ta) and S(Tb) or an intermediate value obtained by substituting the S(Ta) and S(Tb) into a calculation formula designated in advance (S903). This calculation formula may be, for example, a weighted average of S(Ta) and S(Tb), or may be S(Ta) or S(Tb) itself.

Next, an electron beam pulse condition C (here, interval time Tc [seconds]) is set (S904), and then a light irradiation condition is selected within a range designated in advance (S905). The interval time Tc may be the same as the interval time Ta. In this state, the electron beam irradiation is performed for a sample pattern at condition setting coordinates to obtain a secondary electron signal amount Sx(Tc) (S906). Whether Sx(Tc) and Sm(Ta, Tb) are equal is determined, and when Sx(Tc) and Sm(Ta, Tb) are not equal, another light irradiation condition is set, a secondary electron signal amount is acquired again, and similar determination is performed (S907). Here, in determining whether Sx and Sm are equal, a certain reference error range may be designated in advance. Here, such determination is performed for all the light irradiation conditions within the range designated in advance (S912), and when no condition under which Sx and Sm are equal is found, an error indicating that search for the relevant condition is impossible is output, and the process is interrupted (S913). When a condition under which Sx and Sm are equal is found, the light irradiation condition at that time is stored as the light irradiation condition a (S908).

Next, the stage is moved to the inspection target coordinates (S909), and the light irradiation condition a and the electron beam pulse condition C are set to acquire the secondary electron signal amount (S910). Such steps are executed for all inspection target coordinates. Regarding electrical characteristics (resistance, capacitance, and the like) at each set of inspection target coordinates, the resistance value and the capacitance value at each set of inspection target coordinates are calculated and displayed or stored based on the resistance value and the capacitance value of the reference sample obtained in advance, the secondary electron signal value of the reference sample obtained under the same light irradiation condition and electron beam irradiation condition as in step S910, and the secondary electron signal value at each set of inspection target coordinates acquired in step S910 (S911). A step of displaying the secondary electron signal amount acquired in step S910 as a heat map may be provided. In addition, step S911 may be branched to a step of performing inspection again at each set of inspection target coordinates where a certain amount or more of deviation from the reference value occurred under different light irradiation conditions and electron beam pulse conditions to obtain a resistance value and a capacitance value.

Details of the steps in the flow shown in FIG. 9 will be described below. FIG. 10 is obtained by plotting the interval time as the electron beam pulse condition on a horizontal axis, the brightness (secondary electron signal amount) on a vertical axis, and the irradiation light intensity as the light irradiation condition as the parameter. The secondary electron signal amount obtained under the electron beam pulse condition A (interval time Ta) in the state of no light irradiation indicated by the solid line is a secondary electron signal amount in a state of the highest resistance, and since the charging is large, the secondary electron signal amount is small. In particular, when an irradiation current value of the electron beam is sufficiently large and the pulse interval time Ta is 0 seconds (that is, the electron beam is continuously emitted), a saturated state is reached in which charging does not proceed any further.

On the other hand, regarding the secondary electron signal amount under the electron beam pulse condition B (interval time Tb), as the interval time increases, the charge amount decreases and the secondary electron signal amount becomes the largest. In particular, when no change is observed even though the interval time is increased beyond the interval time Tb, it is considered that the charge is completely discharged, so such a point can be considered as a maximum point of the secondary electron signal amount. In contrast, when the resistance value and the capacitance value of the sample are large and the secondary electron signal amount level changes gently even in the vicinity of the interval time Tb, by reducing the equivalent resistance value of the sample by performing irradiation of light having appropriate wavelength and intensity, the maximum secondary electron signal amount can be obtained.

By creating brightness braid, which is an intermediate point of the secondary electron signal amounts at the interval time Ta and the interval time Tb obtained in this way, under the electron beam pulse condition C and the light irradiation condition a, it is possible to generate an intermediate potential between a charge saturation state and a charge-free state. By performing inspection using this state, the charge amount changes in response to the changes in electrical characteristics caused by manufacturing defects of a semiconductor wafer, and the like, and as a result, a change in the secondary electron signal occurs, so that inspection can be performed with high sensitivity. In the above description, a method for determining one light irradiation condition is described, and a plurality of intermediate values Sm may be set, different light irradiation conditions may be obtained for each intermediate value Sm, and inspection may be performed using the plurality of light irradiation conditions.

REFERENCE SIGNS LIST

100: electron microscope main body; 101: electron gun; 102: blanker; 103: aperture; 104: deflector; 105: objective lens; 106: sample; 107: stage; 108: sample table; 109: light source; 110: light path breaker; 111: light path; 112: control device; 113: detector; 114: computation device; 115: input and output device; 116: wafer cassette; 117: wafer loader; 118: preparation chamber; 119: sample chamber; 201: wafer substrate; 202: insulating film; 203: floating conductor; 701: electron optical condition input section; 702: coordinate input section; 703: light irradiation condition input section; 704: electron beam pulse condition input section; 705: light irradiation condition output section; 706: electron beam pulse condition output section; 1301: gate electrode; 1302: junction electrode; 1303: gate; 1304: insulating film; 1305: diffusion layer; 1306: silicon substrate; 1401: gate electrode; 1402: drain electrode; 1403: drain electrode area; 1404: MOS transistor; 1405: wire.

The invention claimed is:

1. Charged particle beam apparatus comprising:
a charged particle optical system configured to irradiate a sample with a pulsed charged particle beam;
an optical system configured to irradiate the sample with light;

a detector configured to detect a secondary charged particle emitted by irradiating the sample with the pulsed charged particle beam;

a control unit configured to control the charged particle optical system to irradiate the sample with the pulsed charged particle beam under a predetermined electron beam pulse condition, and control the optical system to irradiate the sample with the light under a predetermined light irradiation condition; and a computation device configured to set the predetermined electron beam pulse condition and the predetermined light irradiation condition, wherein the computation device sets any one of a plurality of light irradiation conditions as the predetermined light irradiation condition based on a difference between a secondary charged particle signal amount detected by the detector by irradiating the sample with the light under the plurality of light irradiation conditions and irradiating the sample with the pulsed charged particle beam under a first electron beam pulse condition and a secondary charged particle signal amount detected by the detector by irradiating the sample with the light under the plurality of light irradiation conditions and irradiating the sample with the pulsed charged particle beam under a second electron beam pulse condition different from the first electron beam pulse condition.

2. The charged particle beam apparatus according to claim 1, wherein the computation device sets, as the predetermined electron beam pulse condition, two electron beam pulse conditions under which a difference between a secondary charged particle signal amount detected by the detector by irradiating the sample with the light under the predetermined light irradiation condition and irradiating the sample with the pulsed charged particle beam under a third electron beam pulse condition and a secondary charged particle signal amount detected by the detector by irradiating the sample with the light under the predetermined light irradiation condition and irradiating the sample with the pulsed charged particle beam under a fourth electron beam pulse condition exceeds a predetermined threshold value and a sum of interval time that is non-radiation time of the pulsed charged particle beam under the third electron beam pulse condition and interval time under the fourth electron beam pulse condition is minimum, or equal to or less than a predetermined threshold value.

3. The charged particle beam apparatus according to claim 2, wherein the computation device estimates, based on a first secondary charged particle signal amount and a second secondary charged particle signal amount obtained by irradiating the sample with the light under the predetermined light irradiation condition and irradiating the sample with the pulsed charged particle beam under the two predetermined electron beam pulse conditions, a resistance value and a capacitance value of the sample in a state where the light is radiated under the predetermined light irradiation condition.

4. The charged particle beam apparatus according to claim 3, wherein the control unit controls the charged particle optical system to irradiate the sample with the pulsed charged particle beam under any electron beam pulse condition without irradiating the sample with the light, and the computation device estimates, based on a third secondary charged particle signal amount obtained by irradiating the sample with the pulsed charged particle beam under the any electron beam pulse condition without irradiating the sample with the light and the estimated capacitance value of the sample, a resistance value of the sample in a state where the light is not radiated.

5. The charged particle beam apparatus according to claim 1, wherein an electron beam pulse condition controlled by the control unit is interval time, which is non-radiation time of the pulsed charged particle beam, and a light irradiation condition controlled by the control unit is irradiation light intensity of the light.

6. The charged particle beam apparatus according to claim 1, wherein the control unit controls a sampling timing at which the detector detects the secondary charged particle emitted by irradiating the sample with the pulsed charged particle beam.

7. The charged particle beam apparatus according to claim 3, wherein the computation device includes a database that holds, for the sample, information about dependence of a secondary charged particle signal amount on the electron beam pulse condition using the resistance value of the sample as a parameter for each capacitance value of the sample, and estimates the resistance value or the capacitance value of the sample by referring to the database.

8. The charged particle beam apparatus according to claim 2, wherein after the computation device sets the predetermined light irradiation condition, a charge state of the sample is reset, and in order to set the predetermined electron beam pulse condition, the control unit controls the optical system to irradiate the sample whose charge state is reset with the light under the predetermined light irradiation condition.

9. The charged particle beam apparatus according to claim 4, wherein the computation device includes a database that holds, for the sample, information about dependence of a secondary charged particle signal amount on the electron beam pulse condition using the resistance value of the sample as a parameter for each capacitance value of the sample, and estimates the resistance value or the capacitance value of the sample by referring to the database.

* * * * *